United States Patent [19]
Takahashi

[11] Patent Number: 5,153,419
[45] Date of Patent: Oct. 6, 1992

[54] DEVICE FOR DETECTING POSITION OF A LIGHT SOURCE WITH SOURCE POSITION ADJUSTING MEANS

[75] Inventor: Kazuhiro Takahashi, Kawasaki, Japan

[73] Assignee: Canon Kabushiki Kaisha, Tokyo, Japan

[21] Appl. No.: 684,496

[22] Filed: Apr. 15, 1991

Related U.S. Application Data

[63] Continuation of Ser. No. 496,106, Mar. 16, 1990, abandoned, which is a continuation of Ser. No. 246,019, Sep. 14, 1988, abandoned, which is a continuation of Ser. No. 854,175, Apr. 21, 1986, abandoned.

[30] Foreign Application Priority Data

Apr. 22, 1985 [JP] Japan .................. 60-084586

[51] Int. Cl.$^5$ .................................... G01J 1/20
[52] U.S. Cl. .................... 250/201.1; 250/205
[58] Field of Search ............ 250/201, 203 R, 204, 250/205, 208, 209, 216, 201.1, 203.3, 208.2; 355/67, 68; 362/268

[56] References Cited

U.S. PATENT DOCUMENTS

| | | | |
|---|---|---|---|
| 3,423,593 | 1/1969 | Chinnock | 250/201 |
| 3,491,969 | 1/1970 | Muldoon et al. | 250/203 R |
| 3,494,699 | 2/1970 | Gloge | 250/203 R |
| 3,641,885 | 2/1972 | Hill | 355/67 |
| 4,117,375 | 9/1978 | Bachur et al. | 250/205 |
| 4,497,015 | 1/1985 | Konno et al. | 355/67 |
| 4,598,197 | 7/1986 | Morita et al. | 250/205 |
| 4,799,791 | 1/1989 | Echizen et al. | 356/121 |

*Primary Examiner*—David C. Nelms
*Attorney, Agent, or Firm*—Fitzpatrick, Cella, Harper & Scinto

[57] ABSTRACT

A device for detecting the position of a light source of an illumination optical system. The position detecting system of the present invention is particularly suitable for use in the detection of any positional deviation, from a correct position, of a Hg lamp used in a semiconductor device manufacturing exposure apparatus. The device includes an optical system for forming a plane which is optically conjugate with the surface of an object to be illuminated and a member disposed in such a plane and having a pinhole. The light emitted from the light source and passed through the pinhole is received by a photodetector, whereby the positional deviation of the light source is accurately detected. In another aspect of the invention, the detected positional deviation of the light source is automatically adjusted.

32 Claims, 7 Drawing Sheets

DEVICE FOR DETECTING POSITION OF A LIGHT SOURCE WITH SOURCE POSITION ADJUSTING MEANS

This application is a continuation of prior application Ser. No. 07/496,106, filed Mar. 16, 1990, which application is a continuation of prior application Ser. No. 07/246,019, filed Sep. 14, 1988, which application is a continuation of prior application Ser. No. 06/854,175, filed Apr. 21, 1986, all now abandoned.

FIELD OF THE INVENTION AND RELATED ART

This invention relates to a device for detecting a position of a light source of an illumination optical system, for use in adjustment of the position of the light source. For example, the position detecting device of the present invention is particularly suitable for use in adjustment of the position of a light source of an illumination optical system employed in a semiconductor device manufacturing exposure apparatus.

Figure 1:
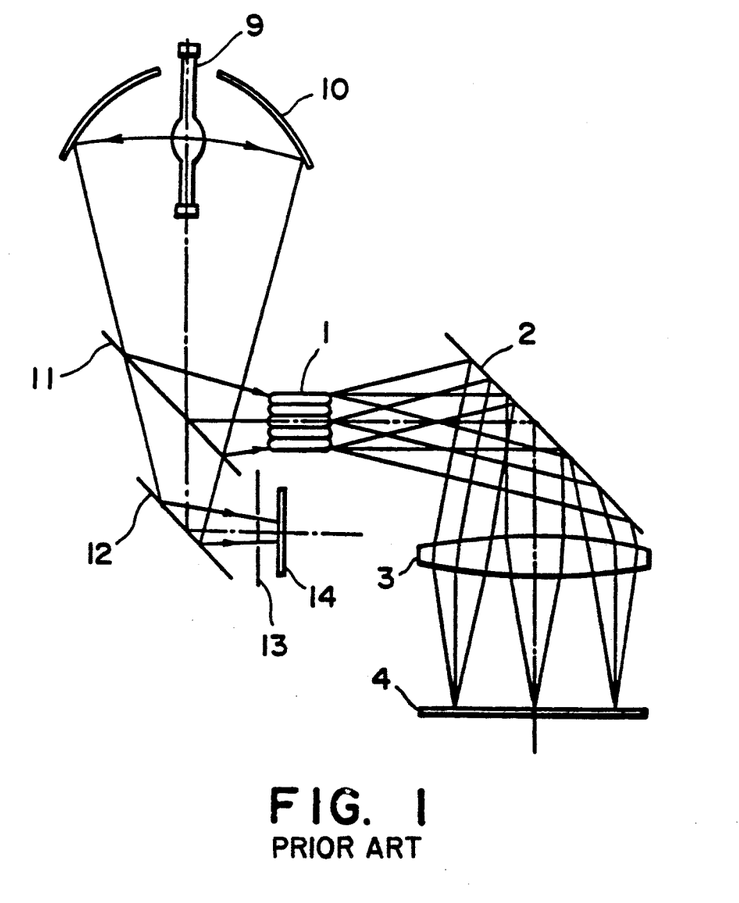
FIG. 1 is a schematic view showing an example of a semiconductor device manufacturing exposure apparatus including a known type position detecting device for detecting the position of a light source of an illumination optical system used in the apparatus.

In conventional semiconductor device manufacturing exposure apparatuses, the adjustment of the position of a light source such as a lamp is effected by use of a pinhole plate 13 and an arc monitoring plate 14 shown in FIG. 1. That is, by means of the pinhole plate 13, an image of a cathode or anode of the lamp is formed on the arc monitoring plate 14 and, while physically observing the position of the thus formed image, the position of the lamp is adjusted manually. More specifically, light emitted from the lamp denoted by numeral 9 is reflected by an elliptical mirror 10 and a portion of the light reflected by the mirror 10 is selected by use of a half mirror or cold mirror 11. The portion of the light, as transmitted through the mirror 11, is reflected by a mirror 12 toward the pinhole plate 13. And, the light passing through the pinhole of the plate 13 is incident on the arc monitoring plate 14 thereby to form thereon an image of the lamp 9, provided that the lamp 9 is at a correct or predetermined position. The arc monitoring plate 14 and the pinhole plate 13 are disposed such that, when the lamp 9 is at a position at which the lamp 9 provides a symmetrical intensity distribution on a light-receiving surface of an optical integrator 1 (which is an optical means for defining plural secondary light sources), a relatively sharp image of the lamp 9 is formed at a predetermined position on the arc monitoring plate 14. If, on the other hand, the lamp 9 is not at the predetermined position, the image of the lamp 9 is not formed at the predetermined position on the arc monitoring plate 14. So, an operator manually handles a supporting portion of the lamp 9 to adjust the position of the lamp, so that the image of the lamp 9 (cathode or anode) is formed at the predetermined position on the arc monitoring plate 14.

Once the lamp 9 is accurately placed at the predetermined position, a regular and symmetrical intensity distribution of light is produced on the light-receiving surface of the optical integrator 1 which is provided to define plural secondary light sources. So, light beams which are emitted from the optical integrator 1, reflected by a mirror 2 and passed through a condenser lens 3, produce on the surface of a photomask 4 a plurality of regular and symmetrical intensity distributions in a partially overlapping manner. As a result, substantially uniform illuminance is attained over the whole surface of the mask 4.

In the position adjusting operation described above, the intensity of the light distribution produced on the optical integrator 1 is not detected. So, even if an image of the lamp 9 is formed at the predetermined position on the arc monitoring plate 14, it is possible that an asymmetrical intensity distribution of light is formed on the optical integrator 1. For instance, there is a liability to occurrence of misalignment of the axis defined by the mirror 12, pinhole plate 13 and arc monitoring plate 14 with respect to the optical axis defined between the focal point position of the elliptical mirror 10 and the center of the optical integrator 1, due to any changes in the optical system with aging or due to any changes in the environmental conditions.

Also, the sharpness of the image formed on the arc monitoring plate 14 is not very high, which leads to difficulties in achieving accurate position adjustment with naked-eye observation. If the lamp 9 is not accurately placed at the predetermined position, the illuminance defined on the mask 4 surface contains unevenness which cannot be neglected in the photolithographic pattern transfer operation for the sake of manufacture of semiconductor devices such as integrated circuits. In consideration thereof, in conventional semiconductor device manufacturing exposure apparatuses, the position adjusting system including the arc monitoring plate 14 is used for the purpose of coarse adjustment of the position of the lamp 9 and, after such coarse adjustment, fine adjustment of the lamp position is effected while detecting an actual illuminance distribution on the mask 4 surface. Thus, cumbersome operations are required for the position adjustment of the lamp.

SUMMARY OF THE INVENTION

It is accordingly a primary object of the present invention to provide a device for detecting the position of a light source of an illumination optical system, by which device the position of the light source is accurately and easily detected.

It is another object of the present invention to provide a device for detecting the position of a light source of an illumination optical system, which device ensures accurate and easy detection of the position of the light source thereby to allow formation of a uniform distribution of illuminance on a surface of an object to be illuminated by the illumination optical system.

It is a further object of the present invention to provide a device for adjusting the position of a light source of an illumination optical system, by which device the position of the light source is accurately and easily detected and then adjusted.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 illustrates how FIGS. 7A and 7B are assembled to form a flow chart showing the position adjusting operation of the position adjusting device according to the FIG. 6A embodiment.

DESCRIPTION OF THE PREFERRED EMBODIMENTS

Figure 2:
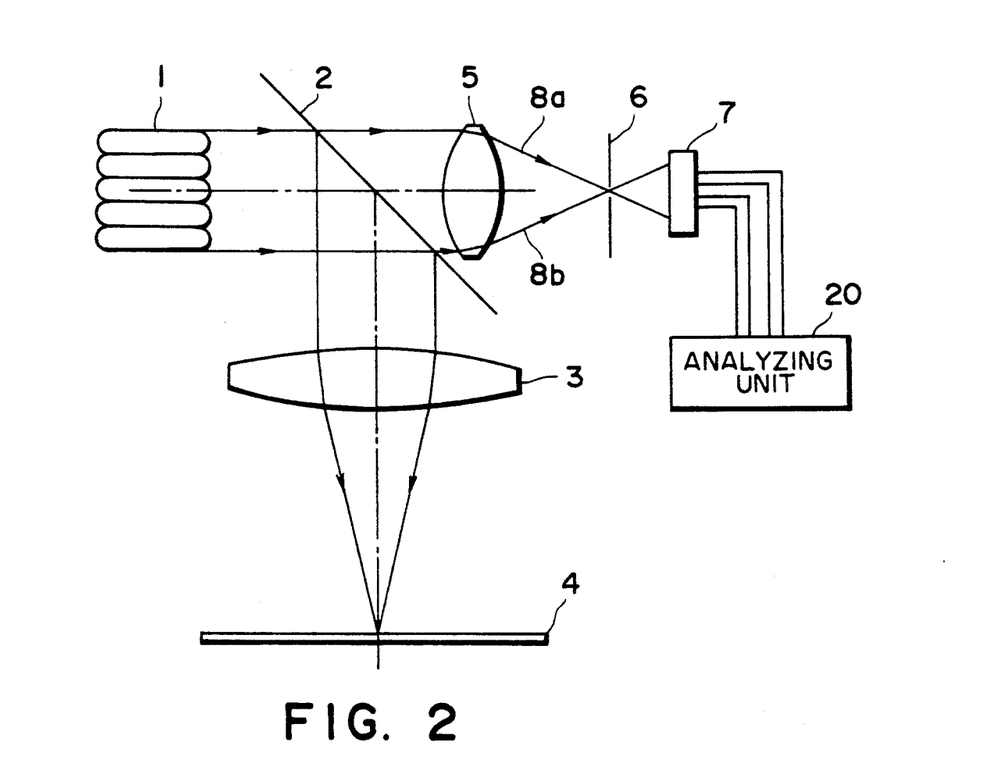
FIG. 2 is a schematic and diagrammatic view showing a fundamental portion of a device for detecting the position of a light source, according to an embodiment of the present invention.

Referring now to FIG. 2, there is shown a portion of an illumination optical system of a semiconductor device manufacturing exposure apparatus and a fundamental structure of a device for detecting the position of a light source of the illumination optical system, according to one embodiment of the present invention.

In FIG. 2, an optical integrator 1 comprises a compound-eye lens, in this embodiment, which is adapted to form a plurality of secondary light sources in response to reception of light from a light source such as the lamp 9 shown in FIG. 1. The light beams emerging from the optical integrator 1 are incident on a half mirror 2 by which the light from the optical integrator 1 is divided into two. That is, the light reflected by the mirror 2 is directed to a condenser lens 3 by which it is focused on the surface of a photomask 4. More specifically, the rays of light emerging from the optical integrator 1 and advancing in the same direction, after they are reflected by the mirror 2, are focused by the lens 3 on a point on the surface of the mask 4. On the other hand, the light passed through the half mirror 2 is concentrated by a condenser lens 5 disposed behind the mirror 2, whereby it is focused on a pinhole plate 6. The pinhole plate 6 is disposed in a plane which is optically conjugate with the surface of the mask 4. The pinhole plate 6 has a pinhole which is formed at a position optically conjugate with the point of center of the mask 4 surface. With this arrangement, the rays of light emerging from the optical integrator 1 and advancing in the same direction (more particularly, in the direction parallel to the optical axis), after they are concentrated by the condenser lens 5, pass through the pinhole of the pinhole plate 6 and then are incident on a light-receiving element 7 which is a photodetector in this embodiment. The light-receiving element 7 is provided to detect the position of the light source, as will be described later. For adjustment of the position of the light source, the position of the light source is changed while monitoring an output of the light-receiving element 7.

Figure 3A:
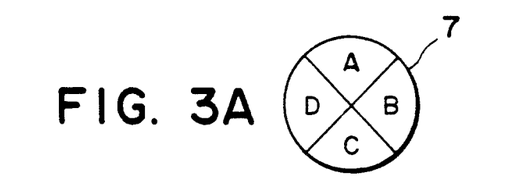
FIG. 3A is a plan view schematically showing a four-division type photodetector used in the embodiment of FIG. 2.
Figure 3B:
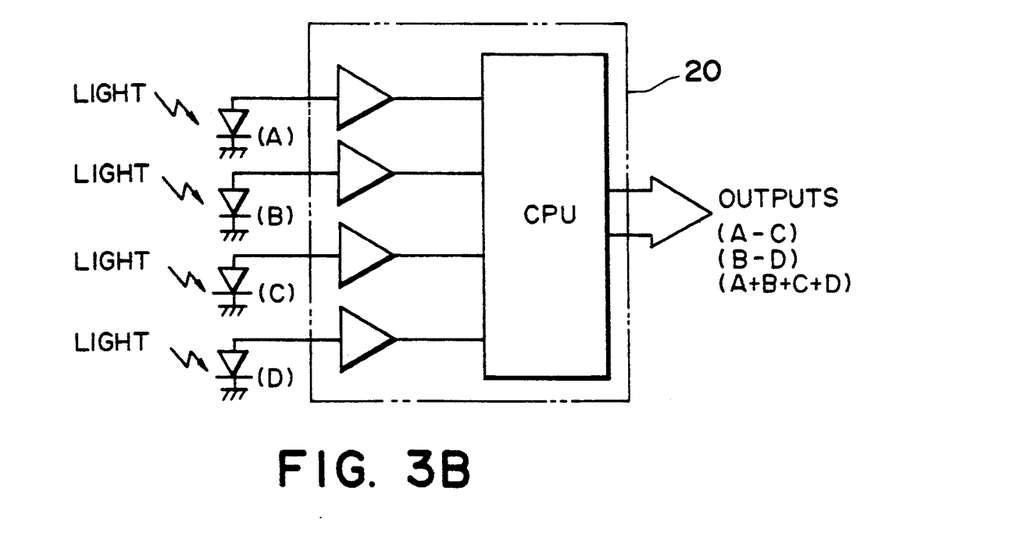
FIG. 3B is a schematic and diagrammatic view showing a signal processing portion of the embodiment of FIG. 2.

Details of the light-receiving element 7 will now be described, taken in conjunction with FIGS. 3A and 3B. In this embodiment, a four-division type photodetector such as shown in FIG. 3A is used as the light-receiving element 7. That is, the photodetector 7 has a light-detecting surface which is divided into four sections A–D having the same areas. The photodetector 7 is so disposed that, when the light source is at a correct or predetermined position and thus, a regular and symmetrical intensity distribution is defined on the optical integrator 1, the light incident on one of two opposing photodetecting sections (e.g. A and C) and the light incident on the other of the two photodetecting sections have substantially the same intensities, while the light incident on one of the remaining two photodetecting sections (e.g. B and D) and the light incident on the other of the aforesaid remaining two photodetecting sections have substantially the same intensities. That is, when the light source is at the predetermined position, the opposing two photodetecting sections (e.g. A and C) produce outputs of the same level, while the remaining two photodetecting sections (e.g. B and D) which are opposed to each other produce outputs of the same level.

The adjustment of the position of the light source, when it is not at the predetermined position, is effected by changing the position of the light source while monitoring the outputs of the photodetecting sections A–D. More particularly, the outputs of the photodetecting sections A–D of the photodetector 7 are supplied to an analyzing unit 20 having amplifiers and a central processing unit (CPU), such as shown in FIG. 3B. In the CPU of the analyzing unit 20, calculations are made on the difference between the outputs of the photodetecting sections A and C, i.e. "$A-C$", the difference between the outputs of the photodetecting sections B and D, i.e. "$B-D$", and the sum of the outputs of the four photodetecting sections, i.e. "$A+B+C+D$". Namely, from the calculations "$A-C$" and "$B-D$", the positional deviation of the light source from the predetermined position with respect to two orthogonal directions contained in a plane perpendicular to the optical axis is detected. And, in accordance with the result of the detection, the position of the light source with respect to the two orthogonal directions in the plane perpendicular to the optical axis is adjusted, so that "$A-C=0$" and "$B-D=0$" are satisfied. Also, the position of the light source in the direction of the optical axis is adjusted by moving the light source in the direction of the optical axis while monitoring the sum of the outputs of the four photodetecting sections A–D. That is, when, during the movement of the light source in the direction of the optical axis, the sum of the outputs of the four photodetecting sections (i.e. "$A+B+C+D$") reaches the maximum level, the light source is fixedly held in that position with respect to the direction of the optical axis.

Satisfaction of "$A-C=0$" and "$B-D=0$" means that a regular and symmetrical intensity distribution is formed on the light-receiving surface of the optical integrator 1. Also, satisfaction of "$A+B+C+D=\text{max.}$" means that a sufficiently high illuminance is attained on the mask 4 surface, thus improving the illumination efficiency.

While, in this embodiment, a four-division type photodetector is used as the light-receiving element 7, an area sensor comprising arrays of charge-coupled devices (CCDs) may be used as the light-receiving element 7.

Figure 4:
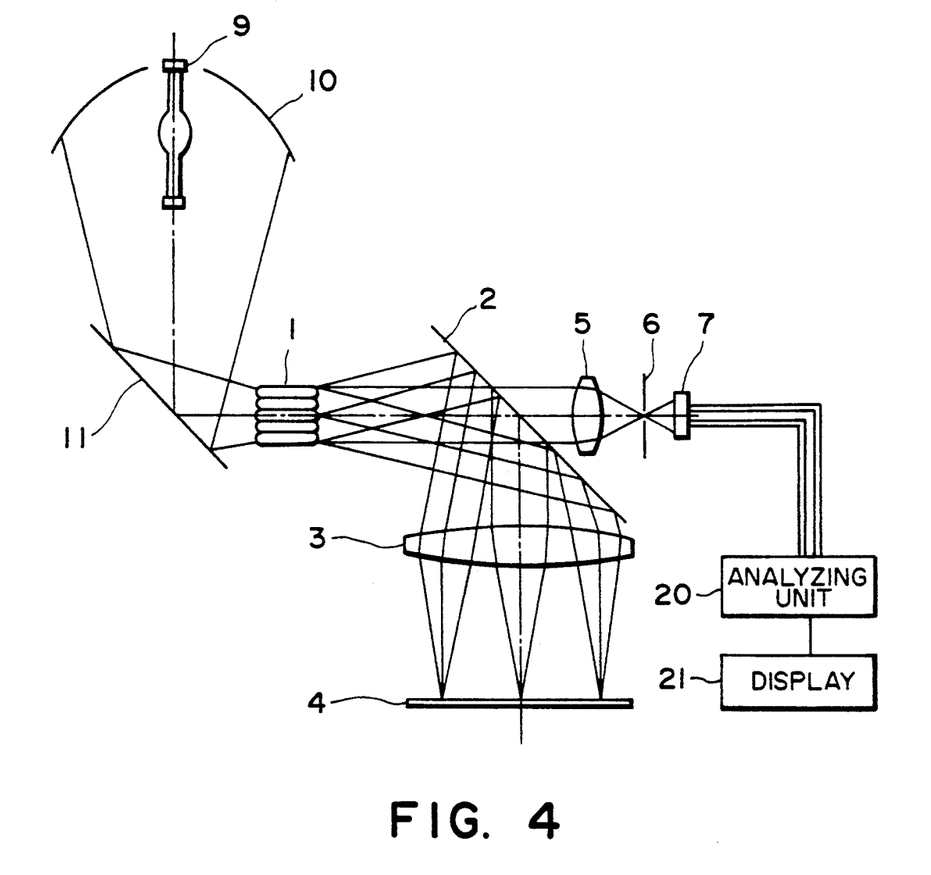
FIG. 4 is a schematic and diagrammatic view of a semiconductor device manufacturing exposure apparatus including a device for detecting the position of a light source, according to another embodiment of the present invention.

FIG. 4 shows an illumination optical system of a semiconductor device manufacturing exposure apparatus, including a position detecting device according to another embodiment of the present invention. Elements shown in FIG. 4 and having similar or corresponding functions as of those shown in FIGS. 1 and 2 are denoted by the same reference numerals.

In FIG. 4, Hg lamp 9 has a center of arc disposed at a first focal-point position of an elliptical mirror 10. Disposed at a second focal-point position of the elliptical mirror 10 is an optical integrator 1 of the same type shown in FIG. 2. Denoted by numeral 11 is a mirror for bending the optical path. While not shown in FIG. 4, a semiconductor wafer onto which a circuit pattern of a photomask 4 is to be transferred, is held by an unshown holder at a position under the mask 4. The position detecting device of the present embodiment, for detecting the position of the lamp 9, has a similar structure as that of the FIG. 2 embodiment and includes a half mirror 2, a condenser lens 5, a pinhole plate 6, a light-receiving element 7 and an analyzing unit 20. The position detecting device of the present embodiment further includes a display unit 21 to which information about the results of analysis on the outputs from the light-receiving element 7 is supplied. That is, the results of the calculations "A−C", "B−D" and "A+B+C+D" are displayed in the display unit 21. This allows easy adjustment. That is, the operator manually handles the support portion of the lamp 9 to change the position of the lamp 9 with respect to the two orthogonal directions in a plane perpendicular to the optical axis while monitoring, through the display unit 21, the relation between the photodetecting sections A and C (FIG. 3A) which should satisfy "A−C=0", as well as the relation between the outputs of the photodetecting sections B and D which should satisfy "B−D=0". Also, the operator changes the position of the lamp 9 with respect to the direction of the optical axis while monitoring, through the display unit 21, the sum of the outputs of the four detecting sections, which should satisfy "A+B+C+D=max.". Once the adjustment is finished, uniform distribution of illuminance is attained over the whole surface of the mask 4.

Figure 5:
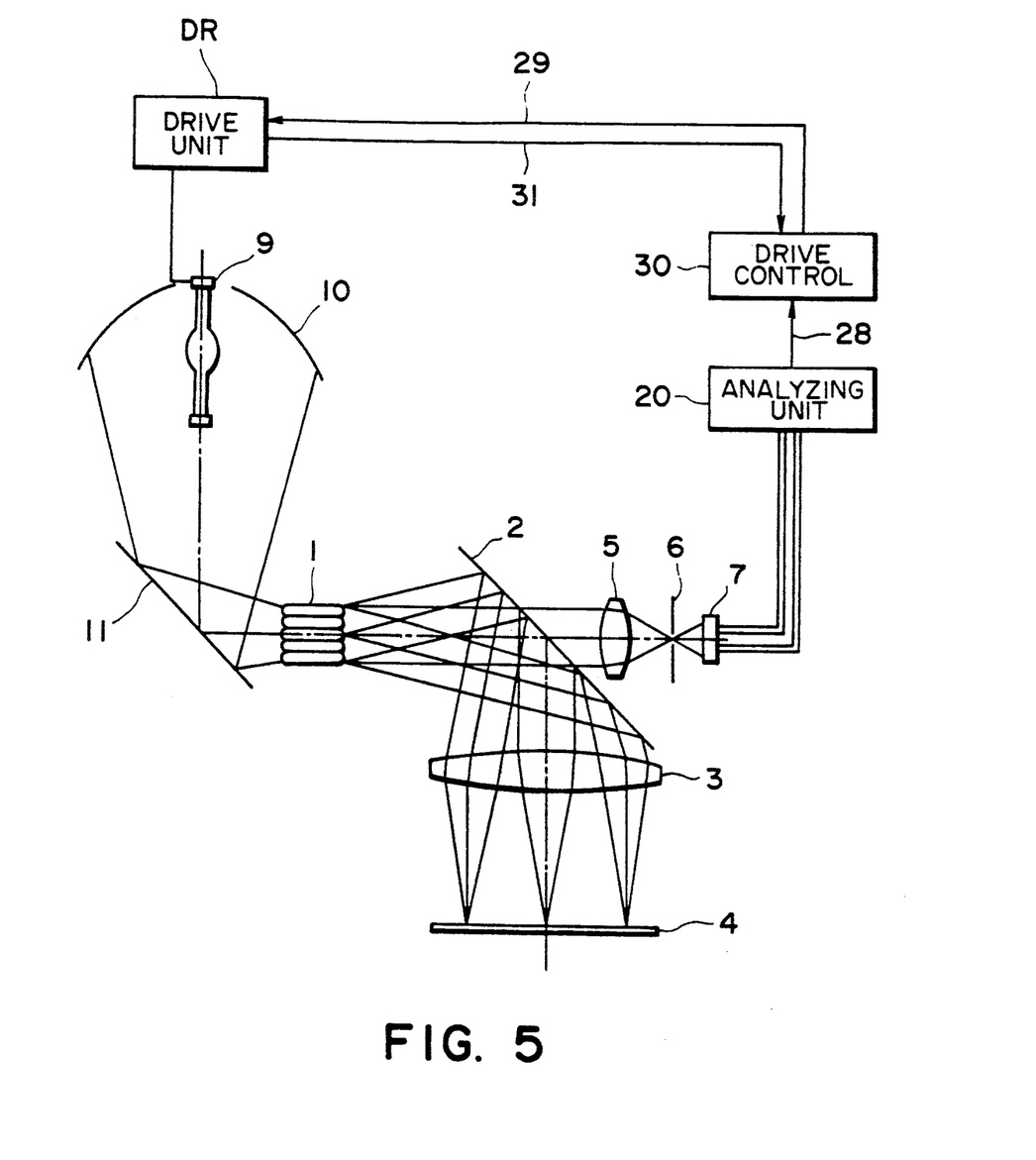
FIG. 5 is a schematic and diagrammatic view of a semiconductor device manufacturing exposure apparatus including a device for adjusting the position of a light source according to a further embodiment of the present invention.

FIG. 5 shows an illumination optical system of a semiconductor device manufacturing exposure apparatus including a device for adjusting the position of a light source, in accordance with another aspect of the present invention. Also in FIG. 5, elements having similar or corresponding functions as those shown in FIGS. 1-4 are denoted by the same reference numerals.

Figure 6:
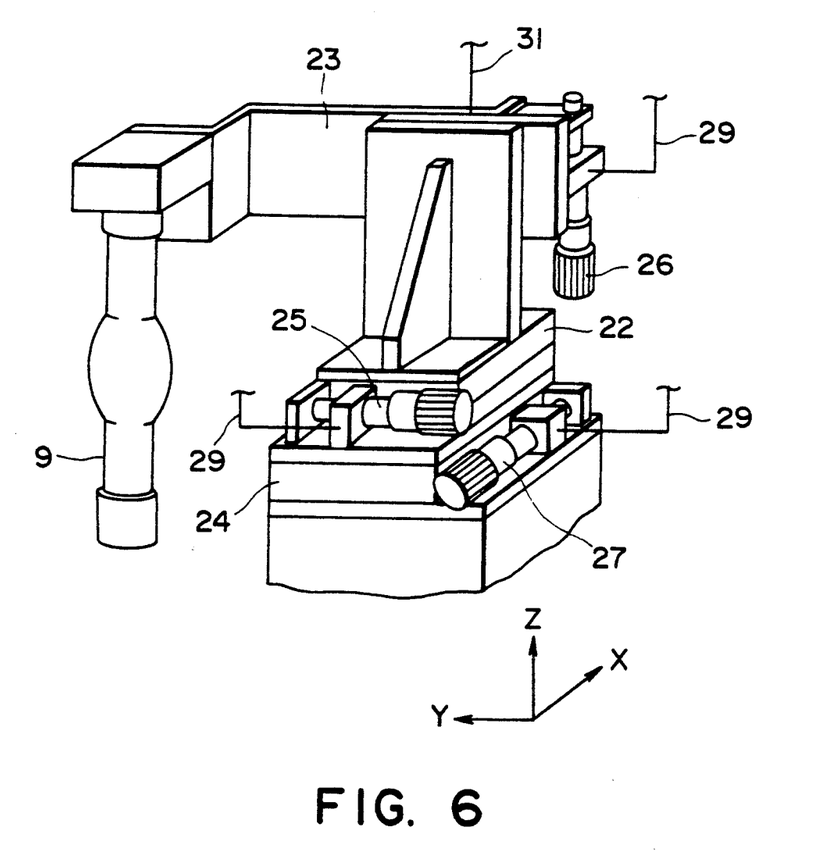
FIG. 6 is an enlarged and fragmentary perspective view showing a driving unit of the embodiment of FIG. 5.

The position adjusting device of the present embodiment for adjusting the position of a light source 9 of the illumination optical system includes a position detecting system comprising a half mirror 2, a condenser lens 5, a pinhole plate 6, a light-receiving element 7 and an analyzing unit 20 which are substantially the same as those described with reference to the foregoing embodiments. In the position adjusting device of the present embodiment, the position of the lamp 9 is automatically adjusted. For this purpose, the device is provided with a driving unit DR for moving the lamp 9 and a driving control unit 30 for controlling the driving unit DR to change the position of the lamp 9. Details of the driving unit DR are shown in FIG. 6.

Figure 7:
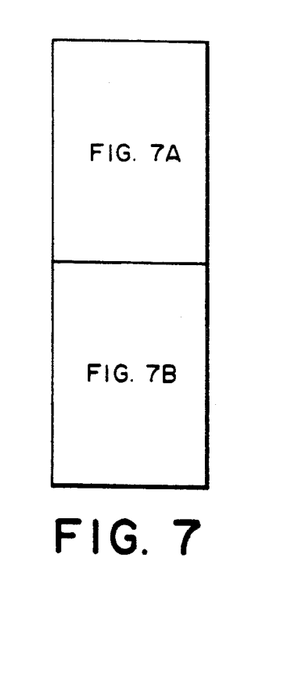

The operation of the position adjusting device of the present embodiment will now be described, taken in conjunction with FIGS. 5 and 6 and with FIG. 7 showing the flow of the position adjusting operation.

As described with reference to the foregoing embodiments, the output signals from the light-receiving element 7 are supplied to the analyzing unit 20 in which predetermined calculations are effected. Output signals of the analyzing unit 20 representing the positional deviation of the lamp 9 are inputted into the drive control unit 30 by way of signal transmitting means 28. In accordance with the input signals, the drive control unit 30 produces instruction signals which are applied to the driving unit DR by way of signal transmitting means 29. As shown in FIG. 6, the driving unit DR comprises three sliders 22, 23 and 24 which are slidably movable in Y, Z and X directions, respectively, and three drive sources 25, 26 and 27 for moving the sliders 22–24 in the Y, Z and X directions, respectively. The output signals of the drive control unit 30, produced in accordance with the result of analysis at the analizing unit 20, are supplied by way of the signal transmitting means 29 to the drive sources 25–27, respectively. Thus, in accordance with these signals, the driving sources 25–27 move the sliders 22–24, respectively, thereby to change the position of the lamp 9. In this embodiment, each of the driving sources 25–27 comprises a driving motor and a ball-screw system which are adapted to push or pull a nut portion mounted on corresponding one of the sliders 22–24 thereby to move the same. Of the sliders 22–24, the slider 22 has an unshown guide for guiding the sliding movement of the slider 23 in the Z direction (positive and negative), and fixedly supports the Z-direction driving source 26. Similarly, the slider 24 has an unshown guide for guiding the sliding movement of the slider 22 in the Y direction (positive and negative), and fixedly supports the Y-direction driving source 25. The X-direction driving source 27 and an unshown guide for guiding the sliding movement of the slider 24 in the X direction (positive and negative) are fixedly mounted on the main body of the exposure apparatus. Thus, the sliders 22–24 and the driving sources 25–27 therefor constitute an Y-Z-X sliding system. For the guiding means of the sliders, linear bearing systems may be used. The sliding direction of the slider 23, which is the Z direction, is parallel to the direction of the optical axis, while the sliding directions of the sliders 22 and 24, which are the Y and X directions, respectively, are perpendicular to the optical axis and also perpendicular to each other. The manner of division of the light-receiving surface of the light-receiving element 7, i.e. the opposing direction of the photodetecting sections A and C and the opposing direction of the photodetecting sections B and D which is perpendicular to the opposing direction of the sections A and C, are determined such that when the sliders 22 and 24 are moved in the Y and X directions, respectively, the ratio of the outputs of the photodetecting sections A and C and the ratio of the outputs of the photodetecting sections B and D are changed most noticeably due to the change in position of the lamp 9.

Figure 7A:
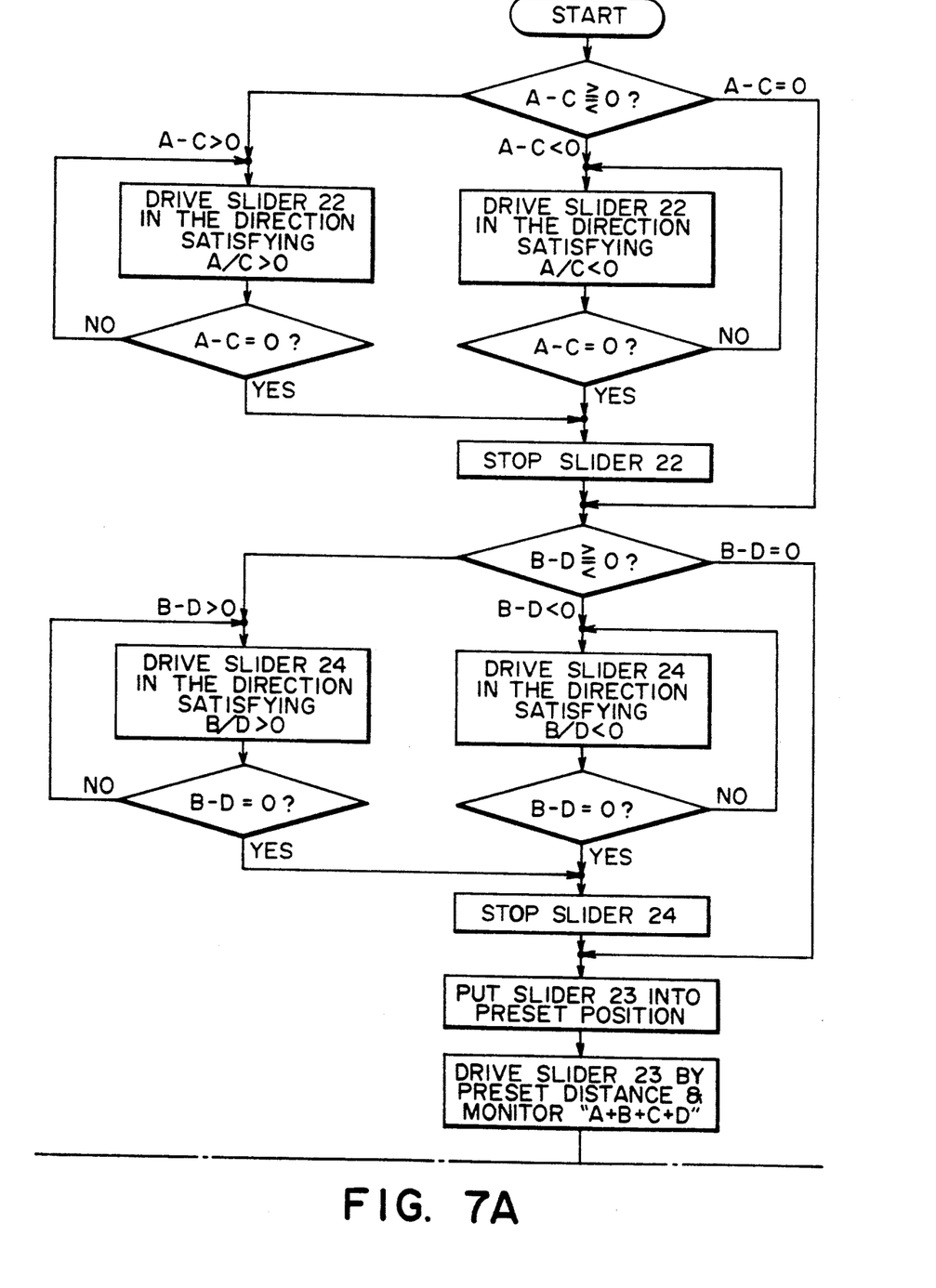
Figure 7B:
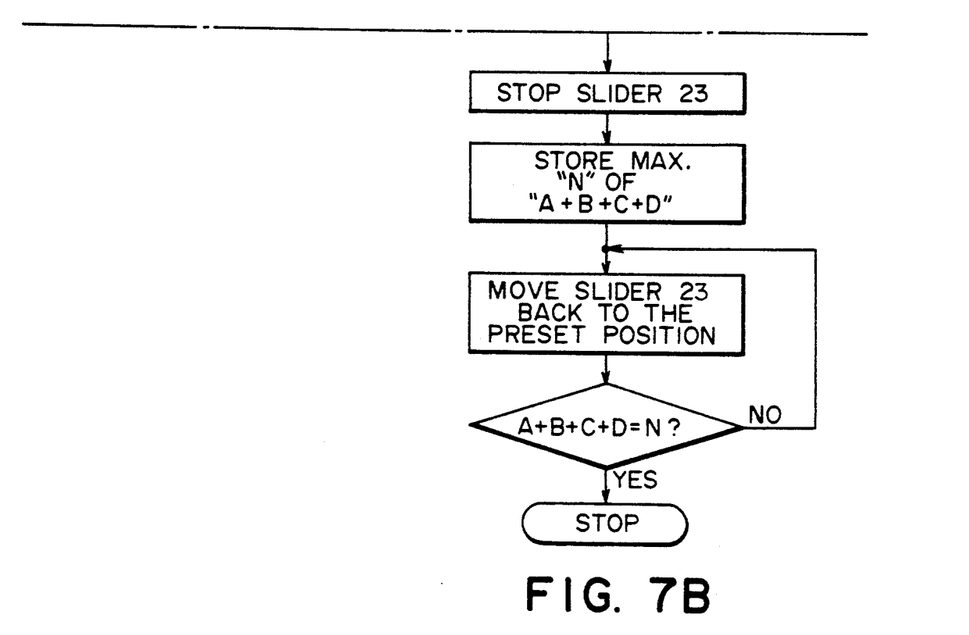

When A−C>0, the drive control unit 30 produces an instruction signal to control the driving source 25 so as to move the slider 22 in a direction reducing the output of the photodetecting section A. During the movement of the slider 22, the relation "A−C" is monitored and, when "A−C=0" is satisfied, the driving source 25 is stopped. If, in such a case, the slider 22 overruns and "A−C<0", the slider 22 is moved in the opposite direction by the driving source 25 so as to satisfy "A−C=0". For the satisfaction of "A−C=0", a tolerance may, of course, be set. That is, for the stop position of the slider 22, a tolerance may be set. If the result of analysis at the analyzing unit 20 shows that A−C<0, the drive control unit 30 produces an instruction signal for moving the slider 22 in a direction increasing the output of the photodetecting section A. When, on the other hand, B−D≠0, the driving source 27 is controlled by the drive control unit 30 in a similar manner as described above. Also, the drive control unit 30 controls the driving source 26 so that the light source 9 is moved through a predetermined section set in the direction of the optical axis. During such movement, the sum of the outputs of the four photodetecting sections are detected and stored and, then, the maximum of "A+B+C+D" is detected and stored. Thereafter, the light source 9 is moved in the opposite direction, i.e. moved back to the initial position while monitoring the sum of the four photodetecting sections. And, when "A+B+C+D=max." is reached, the movement of the light source 9 by the driving source 26 is stopped. For the purpose of such adjustment of the position of the lamp 9 in the direction of the optical axis, the position adjusting device of the present embodiment is provided with detecting means such as a linear potentiometer (not shown) disposed at a position between the sliders 22 and 23, for detecting positional information about the slider 23. The positional information about the slider 23 thus detected is supplied to the drive control unit 30 by way of signal transmitting means 31, so that on the basis of the positional information, the drive control unit 30 controls the driving source 26 so as to move the slider 23 through the predetermined section in the direction of the optical axis, i.e. Z direction. Such a section for movement in the Z direction for the light source 9 should be selected so that the maximum intensity point for the "A+B+C+D" is always included in that section. The flow of operations of the above-described position adjusting operation is illustrated in detail in FIGS. 7A and 7B.

While the invention has been described with reference to the structures disclosed herein, it is not confined to the details set forth and this application is intended to cover such modifications or changes as may come within the purposes of the improvements or the scope of the following claims.

What is claimed is:

1. An illumination device for illuminating an object, comprising:
    a light source;
    an illumination optical system for illuminating the object by use of light from said light source, said illumination optical system having secondary light source forming means arranged to receive the light from said light source to form a plurality of secondary light sources;
    means for detecting the symmetry of a distribution of the intensity of light from said secondary light sources, formed by said secondary light source forming means, with respect to the center of said secondary light source forming means; and
    a half mirror for separating a portion of the light from said secondary light sources for illuminating the object and for directing the separated portion along a path different from that on which the object is illuminated, said detecting means detecting the symmetry of the intensity of light converging upon a point in a plane on said path, said plane being positioned at a location equivalent to the object, thereby to detect the symmetry of the intensity distribution of the light from said secondary light sources.

2. An illumination device for illuminating an object, comprising:
    a light source;
    an illumination optical system for illuminating the object by use of light from said light source, said illumination optical system having secondary light source forming means arranged to receive the light from said light source to form a plurality of secondary light sources, and an optical arrangement, having an optical axis, effective to direct light from said secondary light sources to the object;
    means for detecting the symmetry of a distribution of the light from said secondary light sources, formed by said secondary light source forming means, with respect to the optical axis of said optical arrangement; and
    a half mirror for separating a portion of the light from said secondary light sources for illuminating the object and for directing the separated portion along a path different from that on which the object is illuminated, said detecting means detecting the symmetry of the intensity of light converging upon a point in a plane on said path, said plane being positioned at a location equivalent to the object, thereby to detect the symmetry of the intensity distribution of the light from said secondary light sources.

3. A device according to claim 1, further comprising a controller for controlling the position of said light source, on the basis of the detection by said detecting means.

4. A device according to claim 2, further comprising a controller for controlling the position of said light source, on the basis of the detection by said detecting means.

5. An illumination device for illuminating an object comprising:
    a light source;
    an illumination optical system having secondary light source forming means arranged to receive light from said light source to form a plurality of secondary light sources providing light for illumination of the object;
    means for detecting a distribution of light intensity of the secondary light sources formed by said secondary light source forming means; and
    a controlling arrangement for controlling the position of said light source, on the basis of the detection by said detecting means.

6. An illumination device for illuminating an object comprising:
    a light source;
    an illumination optical system having secondary light source forming means arranged to receive light from said light source to form a plurality of secondary light sources providing light for illumination of the object;
    means for detecting a light intensity distribution at a light emitting surface of said secondary light source forming means; and
    a controlling arrangement for controlling the position of said light source, on the basis of the detection by said detecting means.

7. An illumination device for illuminating an object comprising:
    a light source;
    an illumination optical system having secondary light source forming means arranged to receive light from said light source to form a plurality of secondary light sources providing light for illumination of the object;

means for detecting a light intensity distribution in a secondary light source plane in which the secondary light sources are formed by said secondary light source forming means; and a controlling arrangement for controlling the position of said light source, on the basis of the detection by said detecting means.

8. An apparatus for exposing a wafer to a mask with light, said apparatus comprising:

a light source for emitting light;

illumination means for illuminating the mask with light from said light source, said illumination means comprising an optical integrator for dividing the light from said light source to define a plurality of secondary light sources having a predetermined light intensity distribution on a predetermined plane and an optical system for directing light flux from the plurality of secondary light sources to the mask and for superposing the directed light flux one upon another on the mask;

detecting means comprising a light receiver for detecting an error in symmetry of light intensity distribution upon the predetermined plane with respect to an optical axis of said illumination means, by receiving light from said plurality of secondary light sources through said light receiver; and an adjuster for adjusting the position of said light source relative to said optical integrator to correct for error in symmetry of the light intensity distribution on the predetermined plane.

9. An apparatus for exposing a wafer to a mask with light, said apparatus comprising:

a lamp for emitting light;

an optical integrator for receiving and dividing received light;

a collecting optical system comprising a reflector for directing light from said lamp to said optical integrator, such that said optical integrator divides the received light to define a plurality of secondary light sources on a predetermined plane;

an optical system for directing light flux from the plurality of secondary light sources to the mask and for superposing the directed light flux one upon another on the mask, said optical system comprising a half mirror for extracting a portion of the light from the plurality of secondary light sources;

photoelectric converting means for receiving the extracted light to produce a signal corresponding to light intensity distribution of the received light, wherein the light extracted by said half mirror and received by said photoelectric converting means essentially consists of light rays advancing in the same direction;

detecting means, responsive to the signal produced by said photoelectric converting means, for detecting error in symmetry of the light intensity distribution on the predetermined plane; and an adjuster for adjusting the position of said lamp relative to said optical integrator to correct for error in symmetry of the light intensity distribution on the predetermined plane.

10. An apparatus according to claim 9, wherein said photoelectric converting means comprises a stop member having a pinhole, a lens for focusing light to a point proximate the pinhole, and a sensor having a plurality of light receiving portions for receiving light divergently advancing from the point.

11. An apparatus according to claim 9, wherein said detecting means comprises a display.

12. An apparatus according to claim 9, wherein said adjuster comprises means for displacing said lamp in a direction along, and perpendicular to, an optical axis of said collecting optical system.

13. An exposure method for illuminating a mask with light to expose a wafer to light passing through the mask by using light from a light source to define a plurality of secondary light sources on a predetermined plane and by illuminating the mask with light from the secondary light sources, said method comprising the steps of:

detecting a light intensity distribution of light rays, of the light from the secondary light sources, advancing in a predetermined direction;

detecting error in symmetry of the light intensity distribution on the predetermined plane on the basis of the detected light intensity distribution of the light rays;

adjusting the position of the light source relative to the predetermined plane in response to the detection of the error in symmetry of the light intensity distribution on the predetermined plane, to correct the error; and superposing light flux from the secondary light sources having a corrected symmetrical light intensity distribution, one upon another on the mask, for substantially uniformly illuminating the mask.

14. An exposure apparatus for exposing a mask and a wafer with a radiation beam to thereby print a pattern of the mask on the wafer, said apparatus comprising:

beam supplying means for supplying the radiation beam;

secondary light source forming means for receiving the radiation beam from said beam supplying means to thereby form a secondary light source;

an optical system for illuminating the mask with a radiation beam from said second light source;

detecting means for receiving any of the radiation beam from said secondary light source and for detecting an error in symmetry of an intensity distribution of said secondary light source; and correcting means for substantially correcting the error in symmetry of the intensity distribution of said secondary light source.

15. An apparatus according to claim 14, wherein said beam supplying means comprises a lamp for emitting the radiation beam and an optical system for projecting the radiation beam from said lamp to said secondary light source forming means.

16. An apparatus according to claim 15, wherein said correcting means comprises driving means for changing the position of said lamp.

17. An apparatus according to claim 14, wherein said secondary light source forming means comprises an optical integrator for dividing the received radiation beam into a plurality of radiation beams.

18. An apparatus according to claim 17, wherein said optical integrator comprises a lens array.

19. An apparatus according to claim 18, wherein said beam supplying means comprises a lamp for emitting the radiation beam and an optical system for projecting a radiation beam from said lamp to said secondary light source forming means.

20. An apparatus according to claim 19, wherein said correcting means comprises driving means for changing the position of said lamp.

21. A semiconductor device manufacturing method wherein a radiation beam from a radiation source is transformed into a secondary light source having an intensity distribution and wherein a mask and a wafer are exposed with a radiation beam from the secondary light source to thereby print a pattern of the mask on the wafer, said method comprising the steps of:
 detecting the radiation beam from the secondary light source to detect an error in symmetry of the intensity distribution of the secondary light source; and
 adjusting the intensity distribution of the secondary light source to assure a substantially symmetrical intensity distribution of the secondary light source.

22. A method according to claim 21, further comprising forming the secondary light source by using a lens array for dividing a received radiation beam into a plurality of radiation beams, and directing the plurality of radiation beams to the mask such that the plurality of beams are superposed one upon another on the mask.

23. A method according to claim 21, wherein said error compensating step is based on changing the position of the radiation source.

24. An exposure apparatus for exposing a wafer to a mask with a radiation beam to print a pattern of the mask on the wafer, said apparatus comprising:
 beam supplying means for supplying the radiation beam;
 secondary light source forming means for receiving the radiation beam from said beam supplying means to form a secondary light source;
 an optical system for illuminating the mask with a radiation beam from said secondary light source; and
 detecting means for detecting an intensity distribution of any of the radiation beam from said secondary light source, with respect to a plane which is located off a position of the mask and off a position optically conjugate with the mask.

25. An apparatus according to claim 24, wherein said detecting means comprises a plurality of photoelectric converting devices.

26. An apparatus according to claim 25, further comprising a stop having a pinhole, disposed between said secondary light source and said detecting means and disposed at a position optically conjugate with the mask, wherein each of said photoelectric converting devices receives a portion of the radiation beam passing through the pinhole of said stop.

27. An apparatus according to claim 24, further comprising means for detecting symmetry of the intensity distribution of the secondary light source, on the basis of the detection by said detecting means.

28. An apparatus according to claim 24, further comprising means for adjusting the intensity distribution of said secondary light source.

29. An apparatus according to claim 27, further comprising means for adjusting the intensity distribution of said secondary light source.

30. In a semiconductor device manufacturing method usable with a mask and a wafer, wherein a radiation beam from a radiation source provides a secondary light source having an intensity distribution and wherein the wafer is exposed to the mask with a radiation beam from the secondary light source to print a pattern of the mask on the wafer, the improvement comprising the steps of:
 detecting an intensity distribution of any of the radiation beam from the secondary light source, with respect to a plane which is located off a position of the mask and off a position optically conjugate with the mask, to evaluate the intensity distribution of the secondary light source on the basis of the detection; and
 adjusting the intensity distribution of the secondary light source in accordance with the evaluation.

31. In a semiconductor device manufacturing method usable with a mask and a wafer, wherein a radiation beam from a radiation source provides a secondary light source having an intensity distribution and wherein the wafer is exposed to the mask with a radiation beam from the secondary light source to print a pattern of the mask on the wafer, the improvement comprising the steps of:
 detecting an intensity distribution of any of the radiation beam from the secondary light source, with respect to a plane which is off a position of the mask and off a position optically conjugate with the mask, to detect a balance of the intensity distribution of the secondary light source with respect to a center of the secondary light source; and
 adjusting the intensity distribution of the secondary light source when any unbalance of the secondary light source is detected.

32. In a semiconductor device manufacturing method usable with a mask and a wafer, wherein a radiation beam from a radiation source provides a secondary light source having an intensity distribution and wherein the wafer is exposed to the mask with a radiation beam from the secondary light source to print a pattern of the mask on the wafer, the improvement comprising the steps of:
 detecting an intensity distribution of any of the radiation beam from the secondary light source, with respect to a plane which is located off a position of the mask and off a position optically conjugate with the mask, to detect symmetry of the intensity distribution of the secondary light source; and
 adjusting the intensity distribution of the secondary light source when any asymmetry of the secondary light source is detected.

* * * * *